US008800480B2

(12) United States Patent
Whitfield et al.

(10) Patent No.: US 8,800,480 B2
(45) **Date of Patent: *Aug. 12, 2014**

(54) LASER CLADDING DEVICE WITH AN IMPROVED NOZZLE

(75) Inventors: Ronald Peter Whitfield, Belle River (CA); Omer Leon Hageniers, Windsor (CA)

(73) Assignee: Ronald Peter Whitfield, Belle River (CA)

( * ) Notice: Subject to any disclaimer, the term of this patent is extended or adjusted under 35 U.S.C. 154(b) by 172 days.

This patent is subject to a terminal disclaimer.

(21) Appl. No.: 13/400,211

(22) Filed: Feb. 20, 2012

(65) Prior Publication Data

US 2012/0145769 A1 Jun. 14, 2012

Related U.S. Application Data

(63) Continuation-in-part of application No. 12/249,009, filed on Oct. 10, 2008, now Pat. No. 8,117,985.

(60) Provisional application No. 60/998,188, filed on Oct. 10, 2007.

(51) Int. Cl.

| | |
|---|---|
| ***B05B 5/00*** | (2006.01) |
| ***B05B 7/16*** | (2006.01) |
| ***B05C 19/00*** | (2006.01) |
| ***B05C 11/00*** | (2006.01) |
| ***C23C 14/00*** | (2006.01) |

(52) U.S. Cl.
USPC ........... 118/641; 118/308; 118/665; 118/302; 118/62

(58) Field of Classification Search
CPC ....................................................... C23C 26/02
USPC ......... 118/300, 641–643, 602, 308, 326, 600, 118/663, 666–669, 50.1, 665, 688, 712, 118/302, 62, 63; 219/121.64, 121.66, 219/121.84, 121.63; 427/487, 508; 239/290, 302
See application file for complete search history.

(56) References Cited

U.S. PATENT DOCUMENTS 4,724,299 A 2/1988 Hammeke
5,043,548 A 8/1991 Whitney et al.

(Continued)

FOREIGN PATENT DOCUMENTS

KR 20010081867 A 8/2001

OTHER PUBLICATIONS

PCT International Search Report for PCT International Application No. PCT/IB2008/003856 dated Aug. 3, 2009, 3 pages.

(Continued)

*Primary Examiner* — Yewebdar Tadesse
(74) *Attorney, Agent, or Firm* — Remarck Law Group PLC

(57) ABSTRACT

A laser cladding device for applying a coating to a part comprising a laser which can generate laser light, which is adapted to heat the coating and the part, a main body defining a laser light channel adapted to transmit the laser light to the part, a coating channel adapted to transmit the coating to the part, and a vacuum channel and a nozzle having an exit. The nozzle comprises a delivery port at one end of the laser light channel, a coating port at one end of the coating channel, and a vacuum port at one end of the vacuum channel, wherein the vacuum port is positioned generally adjacent the delivery port In operation the vacuum port draws a vacuum, pulling the coating towards the part.

20 Claims, 9 Drawing Sheets

(56) References Cited

U.S. PATENT DOCUMENTS

| | | | | |
|---|---|---|---|---|
| 5,160,822 | A | 11/1992 | Aleshin | |
| 5,418,350 | A | 5/1995 | Freneaux et al. | |
| 5,453,329 | A | 9/1995 | Everett et al. | |
| 5,477,026 | A | 12/1995 | Buongiorno | |
| 5,659,479 | A | 8/1997 | Duley et al. | |
| 5,837,960 | A | 11/1998 | Lewis et al. | |
| 5,961,862 | A | 10/1999 | Lewis et al. | |
| 6,122,564 | A | 9/2000 | Koch et al. | |
| 6,145,959 | A | 11/2000 | Lund et al. | |
| 6,172,327 | B1 | 1/2001 | Aleshin et al. | |
| 6,316,744 | B1 | 11/2001 | Nowotny et al. | |
| 6,388,227 | B1 | 5/2002 | Dykhno et al. | |
| 6,423,926 | B1 | 7/2002 | Kelly | |
| 6,486,432 | B1 | 11/2002 | Colby et al. | |
| 6,534,745 | B1 | 3/2003 | Lowney | |
| 6,696,664 | B2 | 2/2004 | Pyritz et al. | |
| 6,903,302 | B2 | 6/2005 | Kim et al. | |
| 7,043,330 | B2 | 5/2006 | Toyserkani et al. | |
| 7,259,352 | B2 | 8/2007 | Nakayama et al. | |
| 7,259,353 | B2 | 8/2007 | Guo | |
| 8,117,985 | B2 * | 2/2012 | Whitfield | 118/641 |
| 2002/0008090 | A1 | 1/2002 | Mukasa et al. | |
| 2003/0045420 | A1 | 3/2003 | Koyama et al. | |
| 2004/0168632 | A1 * | 9/2004 | Ito et al. | 118/715 |
| 2004/0197433 | A1 | 10/2004 | Terada et al. | |
| 2004/0251242 | A1 | 12/2004 | Suh | |
| 2005/0056628 | A1 | 3/2005 | Hu | |
| 2005/0120941 | A1 | 6/2005 | Hu et al. | |
| 2005/0132569 | A1 | 6/2005 | Clark et al. | |
| 2005/0178750 | A1 | 8/2005 | Cheng et al. | |
| 2006/0153996 | A1 | 7/2006 | Stanek et al. | |
| 2006/0169679 | A1 | 8/2006 | Sato et al. | |
| 2006/0266740 | A1 | 11/2006 | Sato et al. | |
| 2007/0193981 | A1 | 8/2007 | Peng et al. | |
| 2009/0291197 | A1 * | 11/2009 | Bartels et al. | 427/8 |
| 2010/0173087 | A1 * | 7/2010 | Calla et al. | 427/421.1 |

OTHER PUBLICATIONS

PCT Written Opinion for PCT International Application No. PCT/IB2008/003856 dated Aug. 3, 2009, 7 pages.

PCT International Preliminary Report on Patentability for PCT International Application No. PCT/IB2008/003856 dated Mar. 15, 2011, 8 pages.

Toyserkani, E. et al., "Laser Cladding—Laser Cladding Equipment" published by CRC Press, Chapter 3, 2004, pp. 41-85.

* cited by examiner

LASER CLADDING DEVICE WITH AN IMPROVED NOZZLE

CROSS-REFERENCE TO RELATED APPLICATIONS

This application is a continuation-in-part of U.S. Pat. application No. 12/249,009 entitled "Laser Cladding Device With An Improved Nozzle" and filed on 10 Oct. 2008, now issued as U.S. Pat. No. 8,117,985, which claims priority benefit of U.S. Provisional Patent application No. 60/998,188 filed on Oct. 10, 2007. The entire disclosures of the above applications are incorporated herein by reference.

FIELD

The present invention relates to the field of laser cladding, and more particularly to a laser cladding device having an improved nozzle.

BACKGROUND

Laser cladding by powder metal injection is used in manufacturing, component repair, rapid prototyping and coating. A laser beam travels down a passage to exit out a port in focused alignment with a flow of powdered metal, typically a conical flow around the laser. The laser melts both a thin layer of a surface of a part and the metal powder introduced to the surface, allowing the molten powdered metal to fuse with the surface of the part. This technique is well known for producing parts with enhanced metallurgical qualities such as a superior coating with reduced distortion and enhanced surface quality. Layers of various thicknesses can be formed on the part using laser cladding with the general range being 0.1 to 2.0 mm in a single pass.

Known nozzles for laser cladding have various levels of complexity. A common type is based on a concentric design with the laser beam passing through the center of the nozzle. Surrounding the central laser beam are concentric ports that may be formed as an annulus or continuous ring, segments of rings, or holes which deliver an inert shield inert gas, the powdered metal carried by an inert gas, and in some cases an outer shaping gas. However, such known nozzles for laser cladding assemblies are limited in that the majority of the gas flow is deflected away from the laser weld zone. Therefore a significant amount of the powdered metal directed at the weld zone actually escapes the process altogether. It would be desirable to provide a laser cladding device where the amount of powdered metal delivered to the laser welding zone and therefore to the part is increased.

SUMMARY

In accordance with a first aspect, a laser cladding device for applying a coating to a part comprises a laser which can generate laser light, which is adapted to heat the coating and the part, a main body defining a laser light channel adapted to transmit the laser light to the part, a coating channel adapted to transmit the coating to the part, and a vacuum channel and a nozzle having an exit. The nozzle comprises a delivery port at one end of the laser light channel, a coating port at one end of the coating channel, and a vacuum port at one end of the vacuum channel, wherein the vacuum port is positioned generally adjacent the delivery port. In operation the vacuum port draws a vacuum, pulling the coating towards the part.

From the foregoing disclosure and the following more detailed description of various preferred embodiments it will be apparent to those skilled in the art that the present invention provides a significant advance in the technology of laser cladding devices. Particularly significant in this regard is the potential the invention affords for providing a high quality, low cost laser cladding device with greatly increased powder catchment. Additional features and advantages of various preferred embodiments will be better understood in view of the detailed description provided below.

Figure 1:
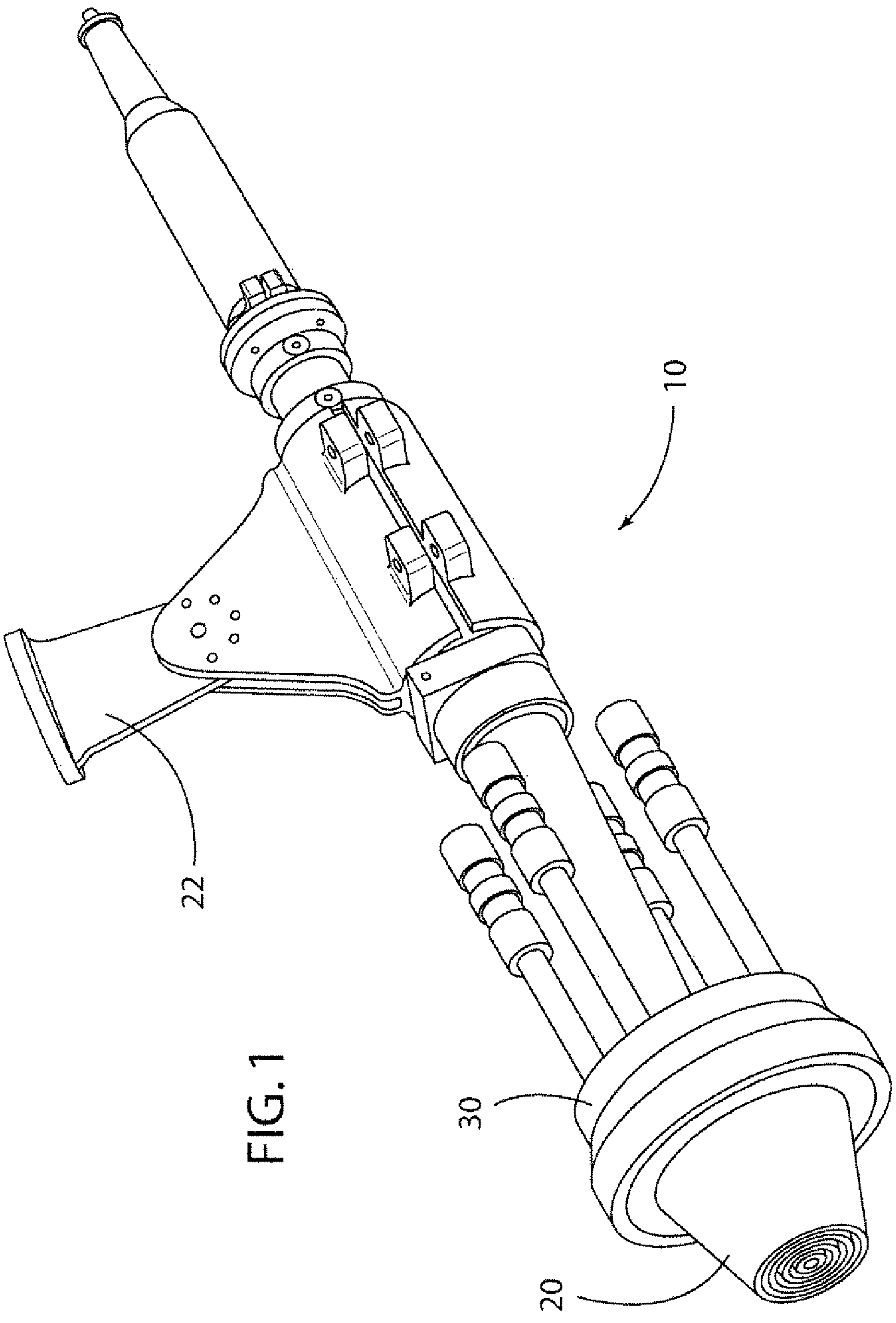
FIG. 1 shows a laser cladding device in accordance with a preferred embodiment, showing a manipulator arm, a main body and a nozzle.

It should be understood that the appended drawings are not necessarily to scale, presenting a somewhat simplified representation of various preferred features illustrative of the basic principles of the invention. The specific design features of the laser cladding device, as disclosed here, including, for example, the specific dimensions of the vacuum port, will be determined in part by the particular intended application and use environment. Certain features of the illustrated embodiments have been enlarged or distorted relative to others to improve visualization and clear understanding. In particular, thin features may be thickened, for example, for clarity of illustration. All references to direction and position, unless otherwise indicated, refer to the orientation illustrated in the drawings.

DETAILED DESCRIPTION

It will be apparent to those skilled in the art, that is, to those who have knowledge or experience in this area of technology, that many uses and design variations are possible for the laser cladding device disclosed here. The following detailed discussion of various alternative and preferred features and embodiments will illustrate the general principles of the invention with reference to a laser cladding device suitable for use in the manufacture of metal parts with enhanced metallurgical properties. Other embodiments suitable for other applications will be apparent to those skilled in the art given the benefit of this disclosure.

Figure 2:
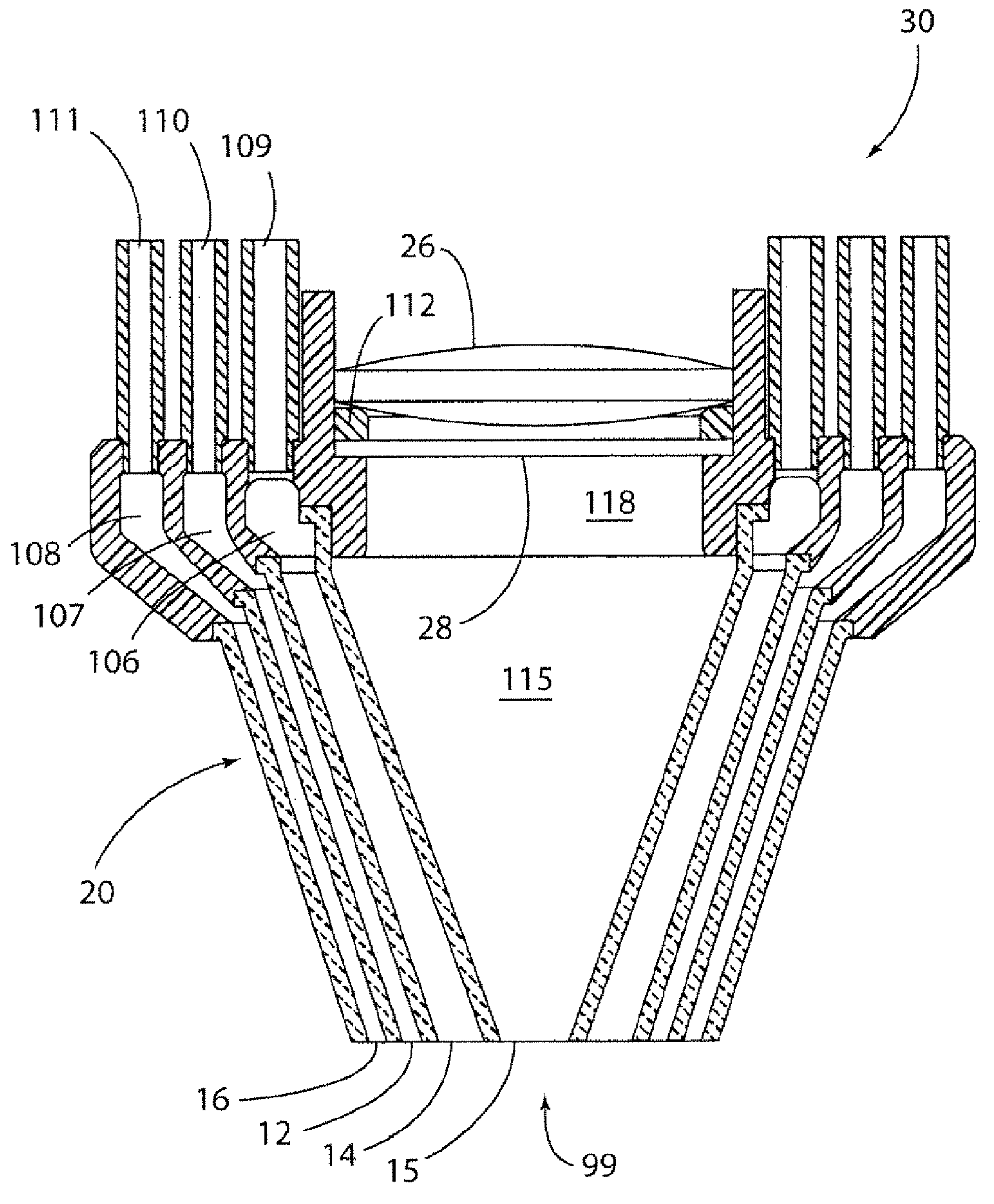
FIG. 2 is a cross section view of the nozzle of FIG. 1.

Turning now to the drawings, FIG. 1 shows a portion of a laser cladding device 10 in accordance with a preferred embodiment. The device is adjustably mounted via manipulator arm 22 connected to main body 30. A nozzle 20 is attached to the main body. The nozzle 20 and main body 30 are preferably formed as separate components, but could be formed of a one piece or unitary construction. Laser light, such as laser beam light from a fiber laser, along with a coating such as a powdered metal are introduced to a part at a work zone adjacent the nozzle. FIG. 2 shows a cross section view of a preferred embodiment of the nozzle 20. The body 30 of the laser cladding device 10 provides mounting for the nozzle 20 and all of the other nozzle components. The laser beam, not shown, passes along a central axis of the laser cladding device 10 through a laser light channel 118, entering a delivery chamber 115 formed in the nozzle 20. As seen in FIG. 2, laser light travels from above and can be focused by lens 26 at a point below and outside an end or exit 99 of the nozzle 20, i.e., at a part in a work zone.

After the laser beam passes through the lens 26 the light can pass through an optional window 28 in the channel 118. The window may be mounted and located by a spacer ring 112 on the main body as shown in FIG. 2. The laser beam then passes into the delivery chamber 115, formed in the nozzle. The delivery chamber 115 may have, for example, a generally circular cross section. Further, an inert gas, not shown may pressurize the delivery chamber 115. This shield gas aids in preventing the accumulation of smoke, powdered metal, and work zone splatter on the window 28, or when the window is not present, on the lens 26. The spacer ring 112 may be adjustable. The lens 26 and window 28 may be optionally adjustable as well.

At the end or exit 99 of the nozzle a series of materials are introduced. From the center delivery chamber 115, the laser light and a shield gas exits a delivery port 15 at the end 99. In accordance with a highly advantageous feature, a vacuum port 14 is provided generally adjacent the delivery port 15. In operation a vacuum or reduced pressure is drawn at the vacuum port 14. In effect, other materials are pulled toward the vacuum port 14. The use of a negative pressure or vacuum zone near the central area of the laser cladding nozzle, i.e., near the delivery port 15, serves to remove some of the inert gas being used to deliver the powdered metal coating and some of the gas which provides the shaping gas flow. The net effect of this negative pressure or vacuum zone is to pull the gas flows towards the central axis of the laser cladding nozzle so that more material arrives at the work zone. This advantageously results in the deposition of more powdered metal in the work zone and less of the powdered metal escaping the work zone.

Figure 9:
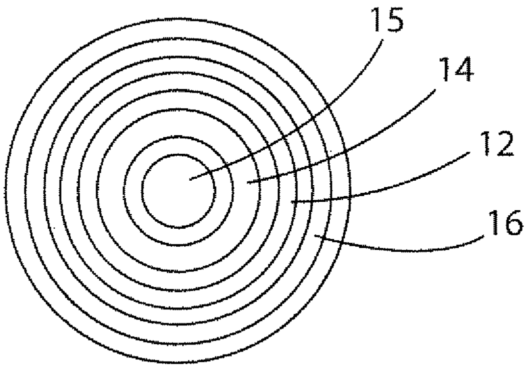
FIG. 9 is an end view of the laser cladding device showing the ports.

FIG. 2 shows the vacuum port 14 connected to a vacuum channel 109. There may be one or more vacuum channels 109, depending in part upon the anticipated flow of gas and material. Also shown is coating port 12 connected to a coating channel 110, and an optional shaping gas port 16 connected to a shaping gas channel 111. As shown in FIG. 2, each port has a generally conical shape. The ports are preferably manufactured from materials that can accommodate high temperatures, such as ceramics, tungsten, titanium, chromalloy, etc. There is no need for them all to be manufactured from the same materials; however, it is expected that the innermost conical shapes are going to be exposed to the highest temperatures as a result of the flow of material and gases. It will be readily apparent to those skilled in the art, given the benefit of this disclosure, that the relative lengths of the ports are for illustrative purposes only and may be adjusted depending upon a given application. As another example, a length of the shaping gas port 16 can exceed a length of the coating port 12. Also, a length of the coating port 12 can exceed a length of the vacuum port 14, and a length of the vacuum port 14 can exceed a length of the delivery port 15 for the laser light. Each port can advantageously form at least part of a ring or annulus around an adjacent port. In the preferred embodiment shown in FIG. 2, the delivery port 15 is in the center, and the vacuum port 14 is immediately adjacent the delivery port, that is, they share a common wall over at least a portion of their length near the end 99. Most preferably the vacuum port circumferentially surrounds the delivery port 15. The coating port 12 is positioned adjacent the vacuum port 14, and the optional gas shaping port 16 is the outermost annulus. FIG. 9 is an end view showing concentric ports 16, 12, 14 positioned around a delivery port 15 for the laser light.

The laser cladding device 10 comprises several components arranged in such a way as to provide flow paths to draw a vacuum, a flow path for an inert gas plus powdered metal or other suitable coating, and a flow path for an optional shaping gas flow. Most preferably the geometry of the laser cladding nozzle's construction is such that the convergence point of all of the gas flows is approximately coincident with a laser focal point. The coating port 12 delivers a coating material to the part to be subjected to the laser cladding process. Typically the coating port delivers a coating material in the form of a powdered metal in combination with an inert gas which urges the powdered metal towards the part. The inert gases used in the laser cladding process can be helium, argon, etc., each of which provides various advantages based on their physical properties, such as, specific heat, density, etc.

An optional chamber 106 in the vacuum port 14 may provide an accumulation volume between the vacuum port and the vacuum channel 109. There may be one or more vacuum channel to vacuum port connections depending upon the anticipated flow of inert gas and powdered metal. Optional chamber 107 in the coating port can provide an accumulation volume between the inert gas and powdered metal connection channel 110 and coating port 12. There may be one or more inert gas and powdered metal piping connections depending upon the anticipated flow of inert gas and powdered metal. Optional chamber 108 in the shaping gas port 16 aligns with the shaping gas channel 111 providing an accumulation volume between the shaping gas channel 111 and the shaping gas port 16. There may be one or more shaping gas piping connections depending upon the anticipated flow of shaping gas.

Figure 3:
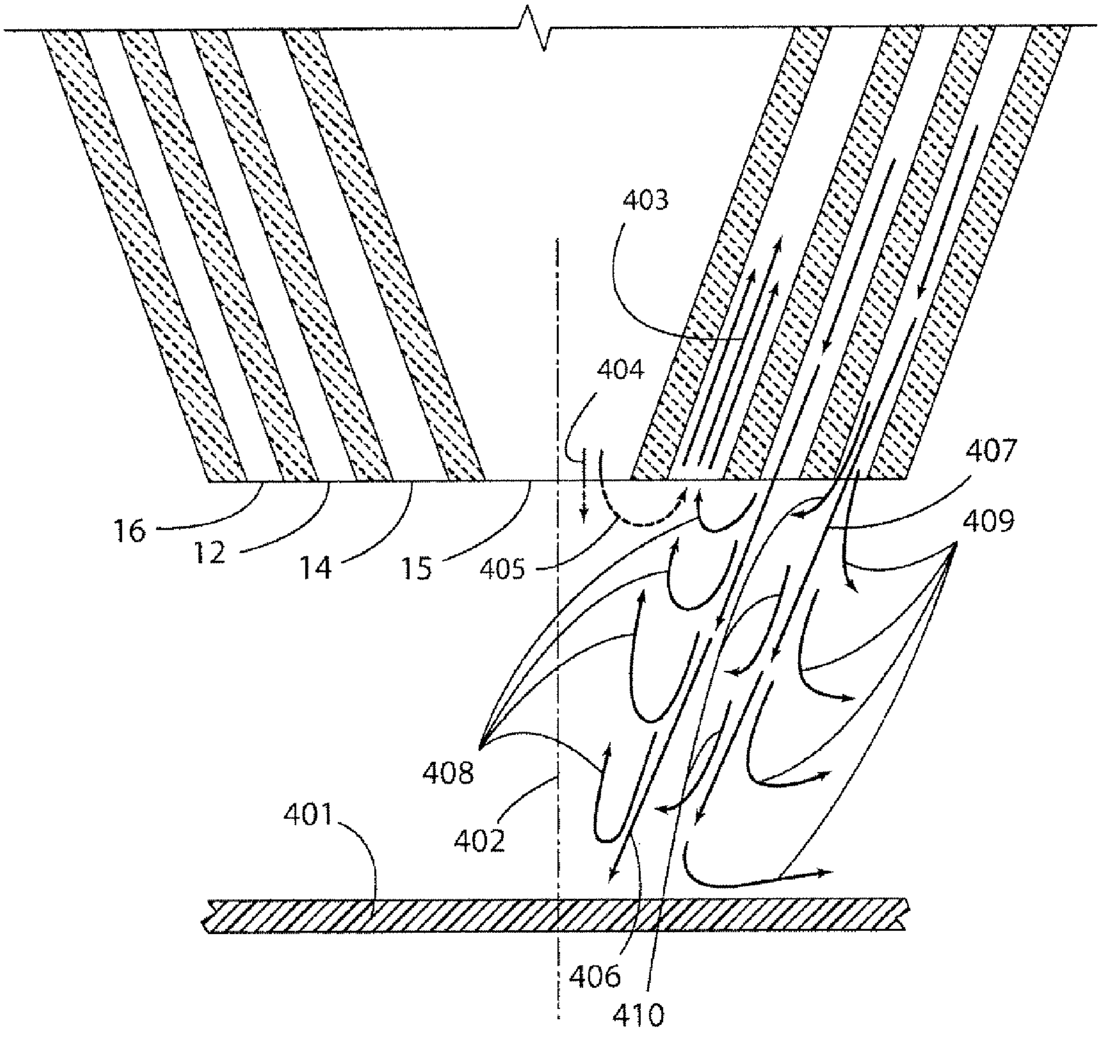
FIG. 3 is a cross section view of the nozzle of FIG. 1 shown with the flow of gases and powdered metal coating shown pulled toward the vacuum port.

FIG. 3 shows an approximate flow of gases and coating materials in response to the vacuum pulled by the vacuum port 14. Arrow 404 corresponds to the direction of laser light, heading parallel to central axis 402, to part 401 in the work zone. The inert gas flows out of and into the laser cladding nozzle 20 are shown with moderate levels of vacuum applied. Only the gas flows to one side of the laser cladding nozzle centerline, 402, are shown for clarity. The influence of the surface of the part 401 that is being laser clad is to ultimately force all of the exiting inert gas flows, 404, 406, and 407 outward in a radial direction away from the nozzle centerline, 402 after they impinge onto the surface of part 401. The influence of a moderate vacuum induces a flow 403 of inert gases and solids (from the coating port 12) into the laser cladding nozzle vacuum port 14. In the cases where there is an inert gas flow into the interior zone of the laser cladding nozzle vacuum port then some of that inert gas will flow (in the direction of arrow 404) out of the interior zone and towards the surface of the part 401 being clad while another portion of that gas will flow (in the direction of arrow 405) into the vacuum port 14 to form part of the vacuum channel flow 403. The majority of the inert gas and powdered metal flow 406 exiting from the coating port 12 travels towards the surface of part 401. However some of the flow 408 is pulled towards the nozzle centerline 402 and enters the vacuum port 14 to make up part of the flow 403. The net effect of the diversion of flow of the inert gas and powdered metal 406 by the flow 408 created by the vacuum channel flow 403 is to keep more of the powdered metal near the centerline 402 of the laser cladding nozzle, and thereby improve metal cladding efficiency. The inert shaping gas flow 407 out of the shaping gas port 16 is also influenced by the flow of gases 403 into the vacuum port 14. While some of the shaping gas flow is still diverted (in the direction of arrow 409) away from the nozzle centerline 402, some flows in the direction of arrow 410 and provides additional radial pressure on the inert gas and powdered metal flow 406, thereby providing additional impetus for the powdered metal to stay in the proximity of the nozzle centerline, 402.

As noted above, some of inert gas flow being delivered by the nozzle will be drawn into the reduced pressure or vacuum zone or opening near the center of the laser cladding nozzle. The amount of inert gas drawn in will depend on three factors, the size of the opening, the shape and location of the opening, and the magnitude of the negative pressure being applied. Based on the values of the above three factors, it is possible to foresee the case where the majority of the inert gas being delivered by the nozzle can be drawn into the negative pressure or vacuum opening in the nozzle. In fact if all of the values are arranged properly it would also be possible to recapture the majority of the powdered metal being delivered by the nozzle. This ability to either recapture or control the amount of powdered metal would allow for a quick and easily controllable means to reduce or cut off the flow of powdered metal as required during the laser cladding process. Such a reduction or complete cut off of powdered metal flow could be advantageous during a laser cladding process that is under automatic computer control, allowing reduction in metal deposition during directional changes or reversal of the path that the laser cladding nozzle is traversing.

Figure 4:
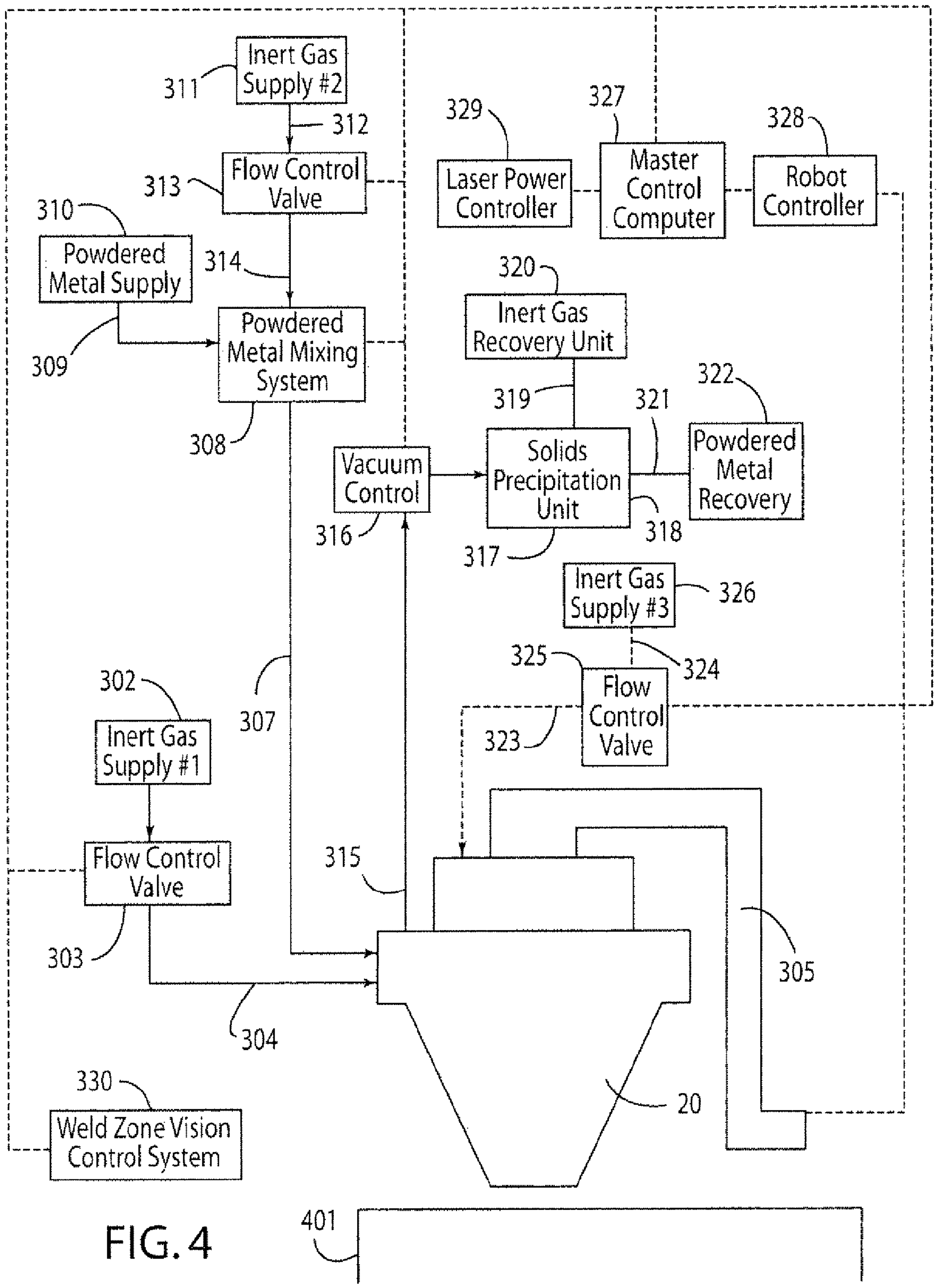
FIG. 4 is a schematic block diagram of a preferred embodiment of a control system for the laser cladding device.

FIG. 4 shows a schematic block diagram of the overall device controller and related components required for using the laser cladding device 10. Overall system control is provided by the master control computer 327 which provides coordination information to and receives data from the control elements in the system; namely, the robot controller, 328, the laser power controller, 329, the shaping gas flow control valve, 303, the powdered metal mixing system, 308, the inert gas control valve for the powdered mixing unit, 313, the vacuum flow control valve, 316, the weld zone vision control system, 330, and the optional interior of the nozzle inert gas control valve, 325. There may of course be many other secondary control sensors that supply information on various aspects of the laser cladding system's operation to the master control computer, 327; their omission from FIG. 4 is done for the sake of simplicity only.

During operation, the laser cladding nozzle 20 is moved over the surface of the part being clad 401 through the use of a robot manipulator 305 under the control of the robot controller 328 as directed by the master control computer 327. Simultaneous with the movement of the laser cladding nozzle 20 over the surface of the part 401 being clad, the laser, not shown, is focused by the laser cladding nozzle optics onto the surface of part 401. At the same time the laser controller 329 controls the power output of the laser as directed by the master control computer 327. Also at the same time, all under the control of the master control computer 327: 1) the flow of the inert shaping gas from supply tank #1, 302 is controlled by flow control valve 303; 2) the flow of inert gas from supply tank #2, 311 is metered into the powdered metal mixing system 308 by the gas flow control valve 313, while powdered metal is drawn from the powdered metal supply tank 310 before the combined inert gas and powdered metal is delivered to the laser cladding nozzle port 14; 3) the vacuum control valve 316 is used to control the level of vacuum present at the laser cladding nozzle port 14, the inert gases and solids collected by the nozzle are passed through the solids precipitation unit 318 and the solids are sent to the powdered metal recovery unit 322 while the inert gases are sent to the inert gas recovery unit 320 which also supplies the vacuum; and 4) optionally, the delivery of inert gas from inert gas tank #3, 326 to the delivery chamber 115 of the laser cladding nozzle channel is controlled by flow control valve 325. A weld or work zone vision control system 330 observes the weld zone and provides control information to the master control computer 327 based on the quality of the cladding being applied. The weld zone vision control system 330 can be fixed in place, mounted on the robot manipulator 305 or mounted on a separate robot manipulator, dependent upon the size and complexity of the surface 401 being laser clad.

Figure 5:
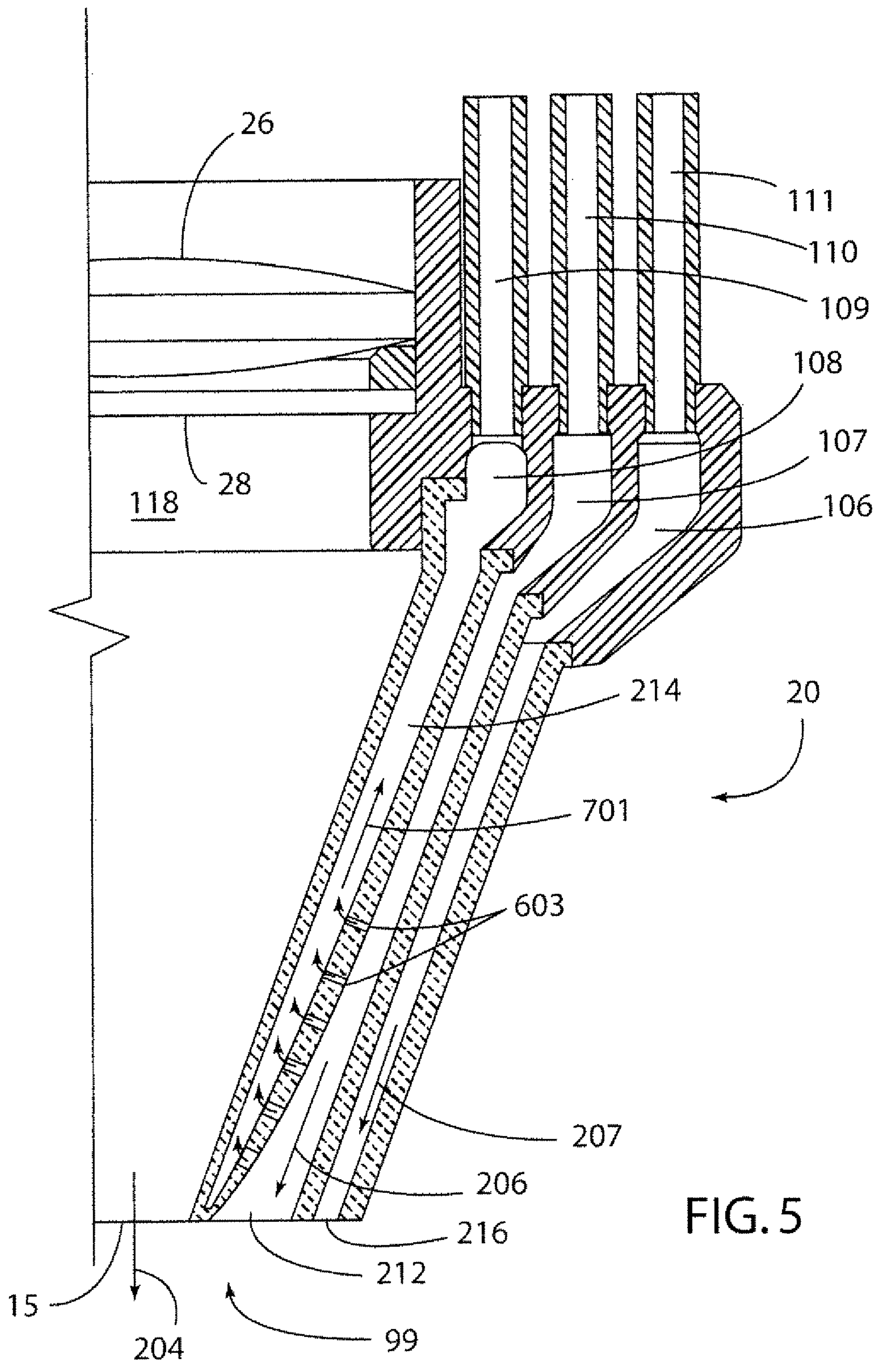
FIG. 5 is an alternate preferred embodiment of a nozzle of a laser cladding device, showing a vacuum port provided with side ports.

FIG. 5 shows an alternate preferred embodiment where the vacuum port 214 is curved and provided with a series of side ports 603 connecting to the coating port 212. Negative pressure or vacuum acts to pull the inert gas jet that is carrying the powdered metal along a curving surface built into the inner wall of the vacuum port. This will impart a velocity towards the central axis of the laser nozzle of the gas jet and the powdered metal that it is carrying. Such a configuration can place more of the powdered metal in the work zone. The side ports may be drilled into a wall connecting between the vacuum port and the coating port. As shown in FIG. 5, more than one side port 603 may be provided. Optionally the side ports 603 may be of varying sizes. As shown in FIG. 5, the side port 603 closest to the exit 99 is larger than the side port 603 most remote from the exit 99. The sizes may be sequentially larger as the side ports 603 approach the exit, as shown. The holes or side ports 603 through the outer wall can be drilled using a high powered laser.

Figure 6:
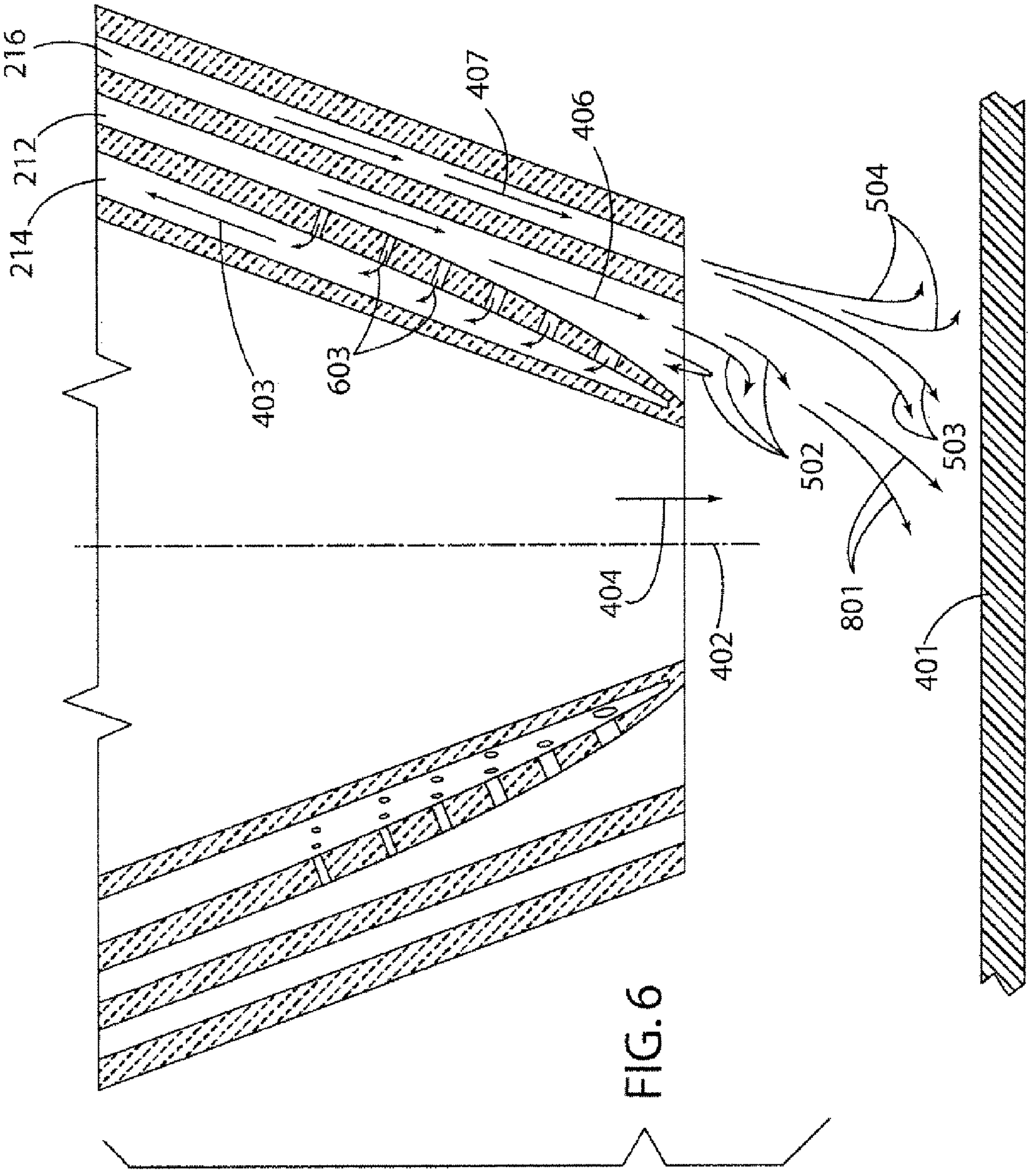
FIG. 6 is a cross section view of the nozzle of FIG. 5 shown with the flow of inert gas and powdered metal shown pulled toward the vacuum port.

With reference to FIG. 6, the inert gas flows out of and into the laser cladding nozzle of the embodiment of FIG. 5 are shown with high levels of vacuum applied. Only the gas flows to one side of the laser cladding nozzle centerline 402 are shown for clarity. The influence of the surface of the part 401 that is being laser clad is to ultimately force all of the exiting inert gas flows, 404, 406, and 407 outward in a radial direction away from the nozzle centerline 402 after they impinge onto the surface of the part 401. The influence of a high vacuum induces a flow 403 of inert gases and solids into the laser cladding nozzle vacuum port 214. In the cases where there is an inert gas flow into the delivery chamber 115 of the nozzle delivery port 15 then most of the inert gas will flow out of the delivery chamber 115 into the vacuum port 214 to form part of the vacuum channel flow 403. Most of the inert gas and powdered metal flow 406 exiting from the coating port 212 travels in several reverse flow paths 502 towards the nozzle centerline 402 and enter the vacuum port to make up part of the flow 403. Therefore essentially none of the powdered metal being carried in the flow 406 exiting the inert coating port 212 will reach the surface of the part 401 being clad. While some of the shaping gas flow 407 is still diverted away from the nozzle centerline 402 as shown by gas flows 504 some of it as shown by gas flows 503 provide additional radial and vertical pressure on the inert gas and powdered metal flow 406 thereby providing additional impetus for the powdered metal to enter the vacuum port 214, and make up part of the gas and material flow 403.

Based on the availability of additional powdered metal in the region of the laser melt zone it would be beneficial to enlarge the size of the laser spot on the surface being clad, using a variable focus depth of the laser beam and cladding a larger surface area with every pass of the laser cladding nozzle. The laser spot size should be variable, since for detail work, a smaller spot will be required than for the cladding of larger areas of the surface. Variation of the laser spot size at the surface being clad can be effected by using a motor driven gear system similar to that used in camera zoom lenses. It would also be beneficial to use a laser range finder, mounted to the laser cladding nozzle, coaxially with the laser beam path to measure the distance to the surface being laser clad. This information can then be used in a control loop to adjust the height of the laser focal spot relative to the surface being clad.

Figure 7:
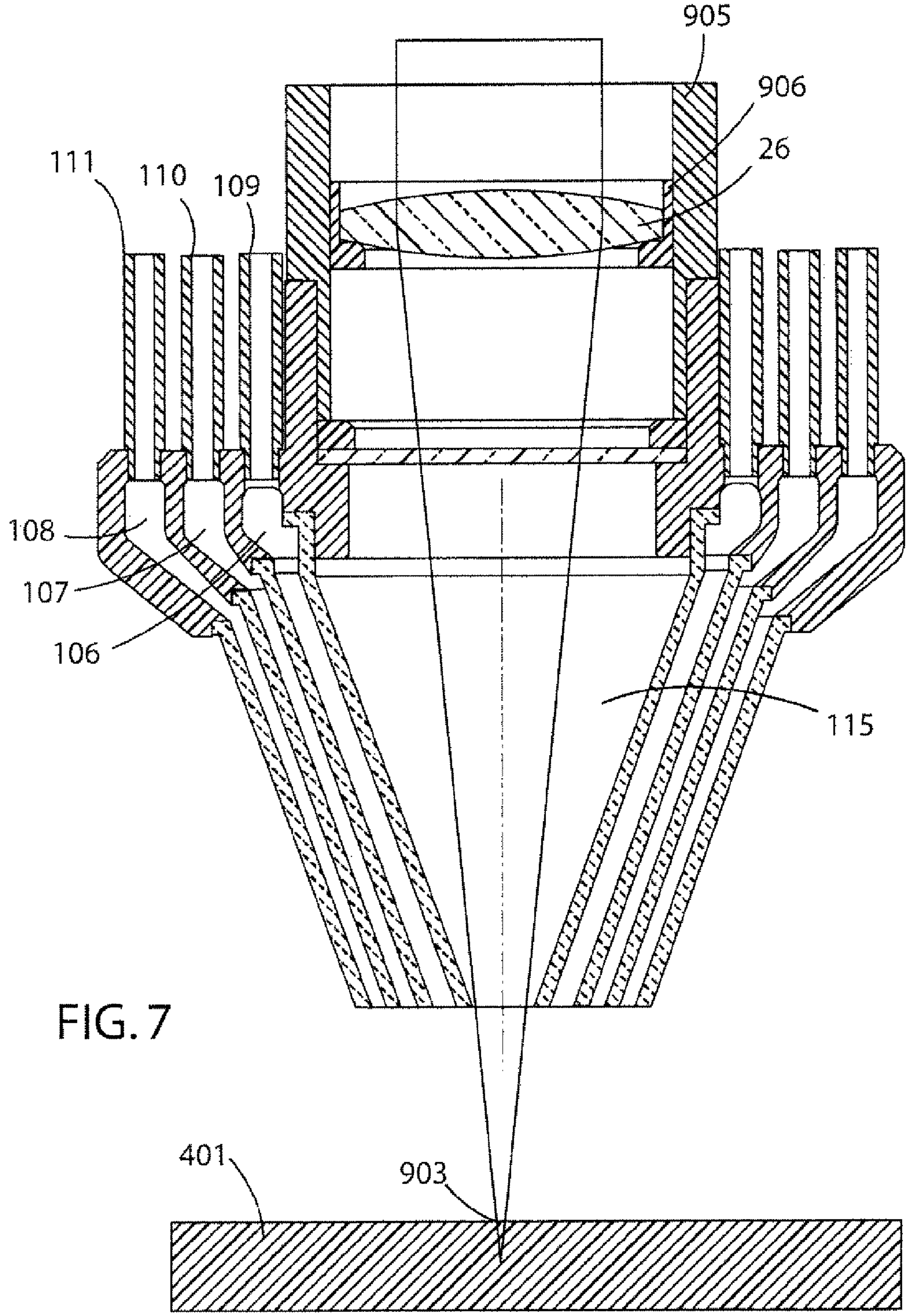
FIG. 7 is another alternate preferred embodiment of a laser cladding device, shown with an adjustably mounted lens.
Figure 8:
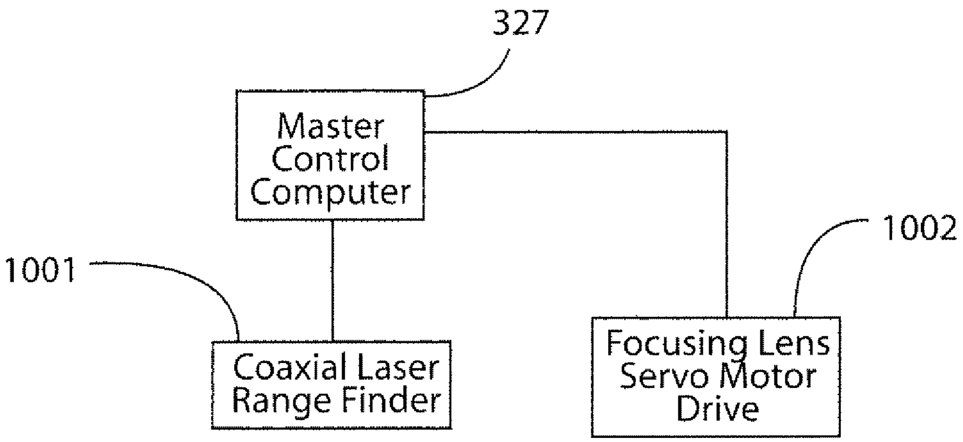
FIG. 8 is a schematic diagram of a preferred embodiment of a controller for the laser cladding device of FIG. 7.

FIG. 7 shows an alternate preferred embodiment wherein the lens 26 is adjustably mounted. FIG. 8 is a schematic diagram where a controller for adjusting the laser work zone 903 on the surface of the part 401 being clad is shown. The control function is carried out by the master control computer 327 which gathers data from a coaxial laser range finder 1001 and sends movement commands to the focusing lens servo motor control 1002. The coaxial laser range finder 1001 can be any one of several commercial units available, based on laser triangulation, focal point determination, or modulation phase detection. The focusing lens servo motor control 1002 can also be a commercial unit that moves the laser focusing lens 26 and its mount 906 relative to the guide housing 905 based on advance or retract signals from the master control computer 327.

Figure 10:
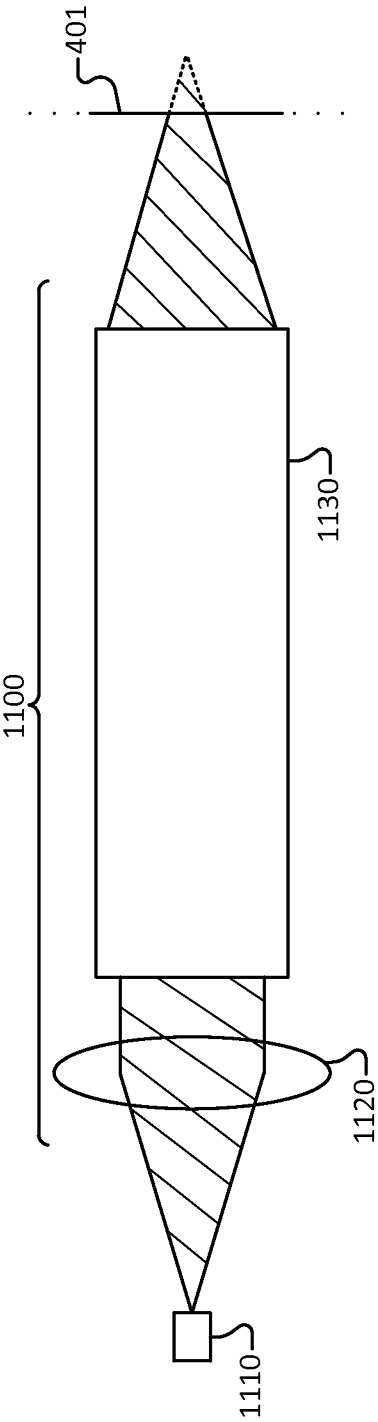
FIG. 10 is a schematic diagram of a zoom lens assembly according to some embodiments of the present disclosure.

FIG. 10 illustrates a zoom lens assembly 1100 that can be utilized with the laser cladding device 10, e.g., to vary the laser spot size as described above. The zoom lens assembly 1100 can receive laser light from a laser light source 1110 (e.g., a laser diode) and transmit laser light to the part 401 to be coated. The laser light heats the coating and the part 401 in the laser work zone to apply the coating to the part 401. The laser light exiting the zoom lens assembly 1100 can be altered from that entering the zoom lens assembly to change one or more characteristics of the laser light. For example only, the zoom lens assembly 1100 can be adjusted by the controller (e.g., master control computer 327) to alter the beam width of the laser light, and/or the focal point of the laser light.

In some embodiments, the zoom lens assembly 1100 can include a collimating lens 1120 and a zoom mechanism 1130. The collimating lens 1120 can receive and collimate the laser light from the laser light source 1110 to direct the laser light towards the part 401. The zoom mechanism 1130 can alter the laser light, e.g., by changing the beam width of the laser light. Additionally or alternatively, the zoom mechanism 1130 can vary the focal point of the laser light exiting the zoom lens assembly 1100. In this manner, the spot size of the laser light on the part 401 that is a specific distance from the laser cladding device 10 can be varied. The zoom mechanism 1130 can include, for example, a zoom collimator in conjunction with a focusing lens, zoom optics or a combination thereof.

The controller (e.g., master control computer 327) can further be configured to control the level of vacuum ("vacuum level") of the vacuum port 14 based on the laser spot size or laser work zone. For example only, as the size of the laser work zone increases the vacuum level may be decreased such that the coating can be provided across the larger area. Similarly, as the size of the laser work zone decreases the vacuum level may be increased such that the coating can be provided across the smaller area, and in some cases the extra coating can be captured by the vacuum port to reduce waste. In some embodiments, the controller can adjust the vacuum level in order to shape the coating flow to correspond to the size of the laser work zone. In this manner, the flow of the coating can be shaped to provide a relatively uniform distribution (within about 20%) of coating particles within the laser work zone. The adjustment of the vacuum level can be automatically performed by the controller upon adjustment of the laser work zone, for example by the user adjusting the laser spot size.

The presence of oxygen in the laser work zone may result in undesirable oxidation of the coating material during the cladding process. In some embodiments the flow of the shaping gas can act as a shielding gas to inhibit oxygen from entering the laser work zone. As the vacuum level is adjusted, e.g., based on the size of the laser work zone, the controller (e.g., master control computer 327) can further be configured to control the level of the flow of shaping gas ("shaping gas flow level") at the shaping gas port 16 to provide proper shielding of the laser work zone. For example only, as the vacuum level increases, the shaping gas flow level may also be increased to provide shielding. Similarly, as the vacuum level decreases the shaping gas flow may also be decreased. The adjustment of the shaping gas flow can be automatically performed by the controller upon adjustment of the laser work zone and/or vacuum level, for example by the user adjusting the laser spot size.

In some embodiments, the laser cladding device 10 can utilize the laser range finder described above to maintain a relatively constant size of the laser work zone (+/−10% of the diameter of the laser spot size). This may be performed through adjustment of the lens 26/zoom lens assembly 1100 based on range information received from the laser range finder during the cladding operation. The range information can include, e.g., information indicative of the distance to the part 401 being clad. In this manner, a part 401 that includes an irregular surface, e.g., a part 401 with low spots ("grooves") and/or high spots ("projections"), can be clad with a relatively consistently sized bead of coating. Additionally, it should be appreciated that the vacuum level and shield gas level can also be adjusted based on the size of the laser work zone/range information such that the coating flow is appropriately shaped and the laser work zone is appropriately shielded, respectively, as described above. The adjustment of the lens 26/zoom lens assembly 1100, the vacuum level, and/or shield gas level can be performed automatically by the controller, e.g., master control computer 327.

From the foregoing disclosure and detailed description of certain preferred embodiments, it will be apparent that various modifications, additions and other alternative embodiments are possible without departing from the true scope and spirit of the invention. The embodiments discussed were chosen and described to provide the best illustration of the principles of the invention and its practical application to thereby enable one of ordinary skill in the art to use the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A laser cladding device for applying a coating to a part, comprising:

a laser configured to generate laser light;

a main body defining: (i) a laser light channel configured to transmit the laser light to the part, (ii) a coating channel configured to transmit the coating to the part, and (iii) a vacuum channel;

a nozzle attached to the main body and defining (i) a delivery port at one end of the laser light channel, (ii) a coating port at one end of the coating channel, and (iii) a vacuum port at one end of the vacuum channel, wherein the vacuum port is positioned generally adjacent the delivery port and in operation the vacuum port draws a vacuum;

a zoom lens assembly configured to receive the laser light and transmit the laser light to the part, wherein the laser light heats the coating and the part in a laser work zone; and a controller configured to adjust the zoom lens assembly such that a size of the laser work zone is variable.

2. The laser cladding device of claim 1, wherein the vacuum port is positioned immediately adjacent the delivery port.

3. The laser cladding device of claim 1, wherein the vacuum port forms at least part of an annulus around the delivery port.

4. The laser cladding device of claim 1, wherein the vacuum port is positioned around the delivery port and the coating port is positioned around the vacuum port.

5. The laser cladding device of claim 1, wherein the nozzle further comprises a shaping gas port, a source of a shaping gas and a connection between the source of the shaping gas and the shaping gas port, and in operation the shaping gas is forced through the shaping gas port.

6. The laser cladding device of claim 1, wherein the controller is further configured to adjust a vacuum level at the vacuum port based on the size of the laser work zone.

7. The laser cladding device of claim 1, wherein the main body further defines a shaping gas channel configured to transmit shaping gas to the part and wherein the nozzle further defines a shaping gas port at one end of the shaping gas channel, the controller being further configured to adjust a shaping gas flow level at the shaping gas port based on the vacuum level.

8. The laser cladding device of claim 1, wherein the zoom lens assembly focuses the laser light and is adjustably mounted in the laser light channel.

9. A laser cladding device for applying a coating to a part, comprising:

a laser;

a main body coupled to the laser and defining a laser light channel, a coating channel, and a vacuum channel;

a nozzle coupled to the main body that defines a delivery port coupled to the laser light channel, a coating port coupled to the coating channel, and a vacuum port coupled to the vacuum channel and positioned generally adjacent the delivery port;

a zoom lens assembly coupled to the nozzle; and a controller configured to adjust the zoom lens assembly, wherein, in order to apply the coating to the part:

(i) the coating travels through the coating channel to exit the nozzle through the coating port to generate a coating flow, (ii) the laser generates laser light that travels through the laser light channel to exit the nozzle through the delivery port to heat the coating flow and the part, (iii) a vacuum is generated by the vacuum channel and vacuum port in order to shape the coating flow;

(iv) the laser heats the coating and the part in a laser work zone; and (v) the controller adjusts the zoom lens assembly to vary a size of the laser work zone.

10. The laser cladding device of claim 9, wherein the vacuum port is positioned immediately adjacent the delivery port.

11. The laser cladding device of claim 9, wherein the vacuum port forms at least part of an annulus around the delivery port.

12. The laser cladding device of claim 9, wherein the vacuum port is positioned around the delivery port and the coating port is positioned around the vacuum port.

13. The laser cladding device of claim 9, wherein the controller adjusts a vacuum level of the vacuum in order to shape the coating flow to correspond to the size of the laser work zone.

14. The laser cladding device of claim 9, wherein the main body further defines a shaping gas channel configured to transmit shaping gas to the part and wherein the nozzle further defines a shaping gas port at one end of the shaping gas channel, the controller being further configured to adjust a shaping gas flow level at the shaping gas port based on the vacuum level.

15. The laser cladding device of claim 9, wherein the zoom lens assembly includes a zoom collimator and a focusing lens.

16. A laser cladding device for applying a coating to a part, comprising:

a laser;

a main body coupled to the laser and defining a laser light channel, a coating channel, and a vacuum channel;

a nozzle coupled to the main body that defines a delivery port coupled to the laser light channel, an annular shaped vacuum port coupled to the vacuum channel and surrounding the delivery port, and an annular shaped coating port coupled to the coating channel and surrounding the vacuum port; and a zoom lens assembly, wherein, in order to apply the coating to the part:

(i) the coating travels through the coating channel to exit the nozzle through the coating port to generate a coating flow, (ii) the laser generates laser light that travels through the laser light channel and the zoom lens assembly to exit the nozzle through the delivery port to heat the coating flow and the part in a laser work zone, and (iii) a vacuum is generated by the vacuum channel and vacuum port in order to shape the coating flow, and wherein adjustment of the zoom lens assembly varies a size of the laser work zone.

17. The laser cladding device of claim 16, wherein the vacuum port is positioned immediately adjacent the delivery port.

18. The laser cladding device of claim 16, further comprising a controller configured to adjust the zoom lens assembly to vary the size of the laser work zone.

19. The laser cladding device of claim 16, wherein the zoom lens assembly includes a zoom collimator and a focusing lens.

20. The laser cladding device of claim 16, wherein a vacuum level of the vacuum is adjusted based on the size of the laser work zone.

* * * * *